(12) United States Patent
Xiao

(10) Patent No.: US 9,564,090 B2
(45) Date of Patent: Feb. 7, 2017

(54) LIQUID CRYSTAL DISPLAY PANEL AND GATE DRIVE CIRCUIT THEREOF

(71) Applicant: Shenzhen China Star Optoelectronics Technology Co., Ltd., Shenzhen, Guangdong (CN)

(72) Inventor: Juncheng Xiao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 139 days.

(21) Appl. No.: 14/426,359

(22) PCT Filed: Nov. 17, 2014

(86) PCT No.: PCT/CN2014/091255
§ 371 (c)(1),
(2) Date: Mar. 5, 2015

(87) PCT Pub. No.: WO2016/070458
PCT Pub. Date: May 12, 2016

(65) Prior Publication Data
US 2016/0335962 A1    Nov. 17, 2016

(30) Foreign Application Priority Data
Nov. 5, 2014  (CN) .......................... 2014 1 0619300

(51) Int. Cl.
*G09G 3/36* (2006.01)
(52) U.S. Cl.
CPC ........ *G09G 3/36* (2013.01); *G09G 2310/0243* (2013.01); *G09G 2310/0286* (2013.01)

(58) Field of Classification Search
CPC ...... G09G 3/36; G09G 3/3674; G09G 3/3677; G09G 3/3681; G09G 3/3266; G09G 2310/0243; G09G 2310/0286; G09G 2310/0202
See application file for complete search history.

(56) References Cited

U.S. PATENT DOCUMENTS 8,325,127 B2   12/2012  Chang
8,704,978 B2    4/2014  Chen
(Continued)

FOREIGN PATENT DOCUMENTS

CN   202771779 U    3/2013
CN   103680386 A    3/2014
(Continued)

*Primary Examiner* — Tom Sheng
(74) *Attorney, Agent, or Firm* — Andrew C. Cheng

(57) ABSTRACT

The present invention provides a liquid crystal display panel and a gate drive circuit thereof. The gate drive circuit comprises a plurality of shift register circuit, and the plurality of shift register circuit are series cascade connected, and each shift register circuit comprises: a first pull-up holding circuit, coupled to the first node, the first clock signal, a first reference voltage and a second reference voltage, and employed to keep a low voltage level of the first node; a compensating circuit, coupled to the first node or the first pull-up holding circuit, and employed to compensate the voltage level of the first node or the first pull-up holding circuit. Thereby, the stability of long-term operation of the gate drive circuit can be promoted to raise the quality of the display panel.

18 Claims, 8 Drawing Sheets

(56) References Cited

U.S. PATENT DOCUMENTS

| | | | |
|---|---|---|---|
| 2003/0043104 A1* | 3/2003 | Lee | G02F 1/1345 345/92 |
| 2006/0001637 A1 | 1/2006 | Pak | |
| 2009/0304138 A1* | 12/2009 | Tsai | G11C 19/28 377/79 |
| 2010/0079443 A1* | 4/2010 | Chang | G09G 3/3677 345/214 |
| 2010/0150303 A1* | 6/2010 | Tsai | G11C 19/28 377/79 |
| 2010/0158187 A1* | 6/2010 | Moon | G09G 3/3266 377/76 |
| 2010/0214279 A1* | 8/2010 | Kim | G09G 3/344 345/213 |
| 2010/0245298 A1* | 9/2010 | Chen | G09G 3/3677 345/204 |
| 2011/0150169 A1 | 6/2011 | Lin | |
| 2011/0234577 A1* | 9/2011 | Yang | G09G 3/3677 345/212 |
| 2012/0139883 A1* | 6/2012 | Lee | G09G 3/3611 345/204 |
| 2014/0044228 A1* | 2/2014 | Jang | G11C 19/00 377/64 |
| 2014/0240209 A1 | 8/2014 | Zhang | |
| 2014/0354523 A1* | 12/2014 | So | G09G 3/3677 345/100 |
| 2015/0029083 A1* | 1/2015 | He | G09G 3/3648 345/100 |
| 2015/0043703 A1* | 2/2015 | Tan | G11C 19/28 377/68 |
| 2015/0294733 A1* | 10/2015 | Tan | G11C 19/28 345/204 |
| 2015/0310819 A1* | 10/2015 | Xiao | G11C 19/28 345/212 |
| 2015/0317954 A1* | 11/2015 | Jang | G09G 3/20 345/213 |

FOREIGN PATENT DOCUMENTS

| | | |
|---|---|---|
| CN | 103928007 A | 7/2014 |
| CN | 104008740 A | 8/2014 |
| CN | 104008742 A | 8/2014 |
| CN | 104064158 A | 9/2014 |
| CN | PA1412242 | 3/2016 |
| WO | WO/2014/012243 | 1/2014 |

* cited by examiner

LIQUID CRYSTAL DISPLAY PANEL AND GATE DRIVE CIRCUIT THEREOF

FIELD OF THE INVENTION

The present invention relates to a touch screen technology field, and more particularly to a mutual capacitance one glass solution gate drive circuit and a manufacture method thereof.

BACKGROUND OF THE INVENTION

GOA (Gate Driver On Array) circuit is to utilize the present array process of the thin film transistor liquid crystal display to manufacture the gate scan driving circuit on the array substrate to realize the driving lin by line.

The GOA circuit comprises a pull-up circuit, a pull-up control circuit, a transfer circuit, a pull-down holding circuit and a boost circuit in charge of boosting the voltage level.

Specifically, the pull-up circuit is in charge of outputting the inputted clock signal into the gates of the thin film transistors for being the drive signals of the liquid crystal display. The pull-up control circuit is in charge of controlling the activation of the pull-up circuit. Generally, it is functioned by the signal transferred from the GOA circuit of the former stage. The pull-down circuit is in charge of rapidly pulling down the scan signals to be low voltage level after the scan signals are outputted. The pull-down holding circuit is in charge of keeping the scan signals and the signal (named as Q point in general) of the pull-up circuit in a close state (i.e. the setup negative voltage level). Generally, two pull-down holding circuit alternately function in turns. The boost circuit is in charge of twice boost of the Q point voltage level for guaranteeing the normal output of the G(N) of the G(N).

The stability of the GOA circuit of prior arts becomes terrible and might results in the GOA circuit failure after the long-term operation.

SUMMARY OF THE INVENTION

The embodiment of the present invention provides a liquid crystal display panel and a gate drive circuit thereof to promote the stability of long-term operation of the gate drive circuit.

The present invention provides a gate drive circuit, comprising a plurality of shift register circuit, and the plurality of shift register circuit are series cascade connected, and each shift register circuit comprises: a pull-up circuit, comprising a first transistor, and a gate of the first transistor is coupled to a first node, and a source is coupled to a first clock signal, and a drain is coupled to a gate signal output end of the shift register circuit; a transfer circuit, comprising a second transistor, and a gate of the second transistor is coupled to the first node, and a source is coupled to the first clock signal, and a drain is coupled to a drive signal output end of the shift register circuit; a pull-up control circuit, comprising a third transistor, and a gate of the third transistor is coupled to drive signal output end of shift register circuit in the two former stage, and a source is coupled to gate signal output end of the shift register circuit in the two former stage, and a drain is coupled to the first node; a boost circuit, coupled between the first node and the gate signal output end of the shift register circuit and employed to boost a voltage level of the first node; a first pull-up holding circuit, coupled to the first node, the first clock signal, a first reference voltage and a second reference voltage, and employed to keep a low voltage level of the first node; a compensating circuit, coupled to the first node or the first pull-up holding circuit, and employed to compensate the voltage level of the first node or the first pull-up holding circuit.

The compensating circuit further comprises a fourth transistor, and a source and a drain of the fourth transistor are coupled to the drive signal output end of the shift register circuit in the latter stage, and a drain of the fourth transistor is coupled to the first node, and employed to boost the voltage level of the first node according to a drive signal outputted from a drive signal output end of the shift register circuit in the latter stage.

The compensating circuit further comprises a fifth transistor, a sixth transistor and a first capacitor, and one end of the first capacitor is coupled to the drain of the third transistor, and the other end of the first capacitor is coupled to a drain of the fifth transistor and a source of the sixth transistor, and a gate of the fifth transistor is coupled to drive signal output end of shift register circuit of four former stage, and a source of the fifth transistor is coupled to the gate signal output end of the shift register circuit of four former stage, and a gate of the sixth transistor is coupled to the drive signal output end of the shift register circuit in the two former stage, and a drain of the sixth transistor is coupled to the first node.

The compensating circuit comprises a fourth transistor, a fifth transistor and a first capacitor, and one end of the first capacitor is coupled to the drain of the third transistor, and the other end of the first capacitor is coupled to a drain of the fourth transistor and a source of the fifth transistor, and a gate of the fourth transistor is coupled to drive signal output end of shift register circuit of four former stage, and a source of the fourth transistor is coupled to the gate signal output end of the shift register circuit of four former stage, and a gate of the fifth transistor is coupled to the drive signal output end of the shift register circuit in the two former stage, and a drain of the fifth transistor is coupled to the first node.

The first pull-up holding circuit further comprises: a fourth transistor, and a gate and a source of the fourth transistor is coupled to the first clock signal, and a drain is coupled to a second node; a fifth transistor, and a gate of the fifth transistor is coupled to the drive signal output end, and a source is coupled to the second node, and a drain is coupled to the second reference voltage; a sixth transistor, and a gate of the sixth transistor is coupled to the drive signal output end of the shift register circuit in the two former stage, and a source is coupled to the second node, and a drain is coupled to the second reference voltage; a seventh transistor, a gate of the seventh transistor is coupled to a second clock signal, and a source is coupled to the first clock signal, and a drain is coupled to the second node; an eighth transistor, and a gate of the eighth transistor is coupled to the compensating circuit, and a source is coupled to the gate signal output end of the shift register circuit, and a drain is coupled to the first reference voltage; a ninth transistor, and a gate of the ninth transistor is coupled to the compensating circuit, and a source is coupled to the first node, and a drain is coupled to the first reference voltage; a tenth transistor, and a gate of the tenth transistor is coupled to the compensating circuit, and a source is coupled to the drive signal output end, and a drain is coupled to the second reference voltage.

The compensating circuit further comprises: a first capacitor, and one end of the first capacitor is coupled to the second node, and the other end is coupled to the gate of the eighth transistor, the gate of the ninth transistor and the gate of the tenth transistor; an eleventh transistor, and a gate of the eleventh transistor is coupled to the drive signal output end of the shift register circuit in the two former stage, and a source is coupled to the first node, and a drain is coupled to the other end of the first capacitor.

The compensating circuit further comprises: a first capacitor, and one end of the first capacitor is coupled to the second node, and the other end is coupled to the gate of the eighth transistor, the gate of the ninth transistor and the gate of the tenth transistor; an eleventh transistor, and a gate of the eleventh transistor is coupled to drive signal output end of shift register circuit in the two latter stage, and a source is coupled to a third reference voltage, and a drain is coupled to the other end of the first capacitor; a twelfth transistor, and a gate of the twelfth transistor is coupled to the other end of the first capacitor, and a source is coupled to the first nodes of the shift register circuits in the two latter stage; a thirteenth transistor, and a gate of the thirteenth transistor is coupled to the drive signal output end of the shift register circuit in the two latter stage, and a source is coupled to the one end of the first capacitor, and a drain is coupled to a drain of the twelfth transistor.

The each shift register circuit further comprises a second pull-up holding circuit, and the second pull-up holding circuit comprises: a fourth transistor, and a gate of the fourth transistor is coupled to drive signal output end of shift register circuit in the four latter stage, and a source is coupled to the first node, and a drain is coupled to the first reference voltage; a fifth transistor, and a gate of the fifth transistor is coupled to the drive signal output end of the shift register circuit in the four latter stage, and a source is coupled to a signal output end of the shift register circuit, and a drain is coupled to the first reference voltage.

The each shift register circuit further comprises a pull-down circuit, and the pull-down circuit comprises: a sixth transistor, and a gate of the sixth transistor is coupled to the drive signal output end of the shift register circuit in the two latter stage, and a source is coupled to the drive signal output end of the shift register circuit, and a drain is coupled to the second reference voltage; a seventh transistor, a gate of the seventh transistor is coupled to the drive signal output end of the shift register circuit in the two latter stage, and a source is coupled to the first node, and a drain is coupled to the first reference voltage; an eighth transistor, and a gate of the eighth transistor is coupled to the drive signal output end of the shift register circuit in the two latter stage, and a source is coupled to the signal output end of the shift register circuit, and a drain is coupled to the first reference voltage.

The present invention further provides a liquid crystal display panel, comprising a gate drive circuit and a plurality of gate lines, wherein the gate lines are respectively coupled to gate signal output end of shift register circuit in the gate drive circuit; the gate drive circuit comprises a plurality of shift register circuit, and the plurality of shift register circuit are series cascade connected, and each shift register circuit comprises: a pull-up circuit, comprising a first transistor, and a gate of the first transistor is coupled to a first node, and a source is coupled to a first clock signal, and a drain is coupled to a gate signal output end of the shift register circuit; a transfer circuit, comprising a second transistor, and a gate of the second transistor is coupled to the first node, and a source is coupled to the first clock signal, and a drain is coupled to a drive signal output end of the shift register circuit; a pull-up control circuit, comprising a third transistor, and a gate of the third transistor is coupled to drive signal output end of shift register circuit in the two former stage, and a source is coupled to gate signal output end of the shift register circuit in the two former stage, and a drain is coupled to the first node; a boost circuit, coupled between the first node and the gate signal output end of the shift register circuit and employed to boost a voltage level of the first node; a first pull-up holding circuit, coupled to the first node, the first clock signal, a first reference voltage and a second reference voltage, and employed to keep a low voltage level of the first node; a compensating circuit, coupled to the first node or the first pull-up holding circuit, and employed to compensate the voltage level of the first node or the first pull-up holding circuit.

The compensating circuit further comprises a fourth transistor, and a source and a drain of the fourth transistor are coupled to the drive signal output end of the shift register circuit in the latter stage, and a drain of the fourth transistor is coupled to the first node, and employed to boost the voltage level of the first node according to a drive signal outputted from a drive signal output end of the shift register circuit in the latter stage.

The compensating circuit further comprises a fifth transistor, a sixth transistor and a first capacitor, and one end of the first capacitor is coupled to the drain of the third transistor, and the other end of the first capacitor is coupled to a drain of the fifth transistor and a source of the sixth transistor, and a gate of the fifth transistor is coupled to drive signal output end of shift register circuit of four former stage, and a source of the fifth transistor is coupled to the gate signal output end of the shift register circuit of four former stage, and a gate of the sixth transistor is coupled to the drive signal output end of the shift register circuit in the two former stage, and a drain of the sixth transistor is coupled to the first node.

The compensating circuit comprises a fourth transistor, a fifth transistor and a first capacitor, and one end of the first capacitor is coupled to the drain of the third transistor, and the other end of the first capacitor is coupled to a drain of the fourth transistor and a source of the fifth transistor, and a gate of the fourth transistor is coupled to drive signal output end of shift register circuit of four former stage, and a source of the fourth transistor is coupled to the gate signal output end of the shift register circuit of four former stage, and a gate of the fifth transistor is coupled to the drive signal output end of the shift register circuit in the two former stage, and a drain of the fifth transistor is coupled to the first node.

The first pull-up holding circuit further comprises: a fourth transistor, and a gate and a source of the fourth transistor is coupled to the first clock signal, and a drain is coupled to a second node; a fifth transistor, and a gate of the fifth transistor is coupled to the drive signal output end, and a source is coupled to the second node, and a drain is coupled to the second reference voltage; a sixth transistor, and a gate of the sixth transistor is coupled to the drive signal output end of the shift register circuit in the two former stage, and a source is coupled to the second node, and a drain is coupled to the second reference voltage; a seventh transistor, a gate of the seventh transistor is coupled to a second clock signal, and a source is coupled to the first clock signal, and a drain is coupled to the second node; an eighth transistor, and a gate of the eighth transistor is coupled to the compensating circuit, and a source is coupled to the gate signal output end of the shift register circuit, and a drain is coupled to the first reference voltage; a ninth transistor, and a gate of the ninth transistor is coupled to the compensating circuit, and a source is coupled to the first node, and a drain is coupled to the first reference voltage; a tenth transistor, and a gate of the tenth transistor is coupled to the compensating circuit, and a source is coupled to the drive signal output end, and a drain is coupled to the second reference voltage.

The compensating circuit further comprises: a first capacitor, and one end of the first capacitor is coupled to the second node, and the other end is coupled to the gate of the eighth transistor, the gate of the ninth transistor and the gate of the tenth transistor; an eleventh transistor, and a gate of the eleventh transistor is coupled to the drive signal output end of the shift register circuit in the two former stage, and a source is coupled to the first node, and a drain is coupled to the other end of the first capacitor.

The compensating circuit further comprises: a first capacitor, and one end of the first capacitor is coupled to the second node, and the other end is coupled to the gate of the eighth transistor, the gate of the ninth transistor and the gate of the tenth transistor; an eleventh transistor, and a gate of the eleventh transistor is coupled to drive signal output end of shift register circuit in the two latter stage, and a source is coupled to a third reference voltage, and a drain is coupled to the other end of the first capacitor; a twelfth transistor, and a gate of the twelfth transistor is coupled to the other end of the first capacitor, and a source is coupled to the first nodes of the shift register circuits in the two latter stage; a thirteenth transistor, and a gate of the thirteenth transistor is coupled to the drive signal output end of the shift register circuit in the two latter stage, and a source is coupled to the one end of the first capacitor, and a drain is coupled to a drain of the twelfth transistor.

The each shift register circuit further comprises a second pull-up holding circuit, and the second pull-up holding circuit comprises: a fourth transistor, and a gate of the fourth transistor is coupled to drive signal output end of shift register circuit in the four latter stage, and a source is coupled to the first node, and a drain is coupled to the first reference voltage; a fifth transistor, and a gate of the fifth transistor is coupled to the drive signal output end of the shift register circuit in the four latter stage, and a source is coupled to a signal output end of the shift register circuit, and a drain is coupled to the first reference voltage.

The each shift register circuit further comprises a pull-down circuit, and the pull-down circuit comprises: a sixth transistor, and a gate of the sixth transistor is coupled to the drive signal output end of the shift register circuit in the two latter stage, and a source is coupled to the drive signal output end of the shift register circuit, and a drain is coupled to the second reference voltage; a seventh transistor, a gate of the seventh transistor is coupled to the drive signal output end of the shift register circuit in the two latter stage, and a source is coupled to the first node, and a drain is coupled to the first reference voltage; an eighth transistor, and a gate of the eighth transistor is coupled to the drive signal output end of the shift register circuit in the two latter stage, and a source is coupled to the signal output end of the shift register circuit, and a drain is coupled to the first reference voltage.

With the aforesaid solutions, the benefits of the present invention are: the compensating circuit is coupled to the first node or the first pull-up holding circuit, employed to compensate the voltage level of the first node or the first pull-up holding circuit which is capable of promoting the stability of long-term operation of the gate drive circuit to raise the quality of the display panel.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise, wherein.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are merely part of embodiments of the present invention, but not all embodiments. Based on the embodiments of the present invention, all other embodiments to those of ordinary skill in the premise of no creative efforts obtained, should be considered within the scope of protection of the present invention.

Figure 1:
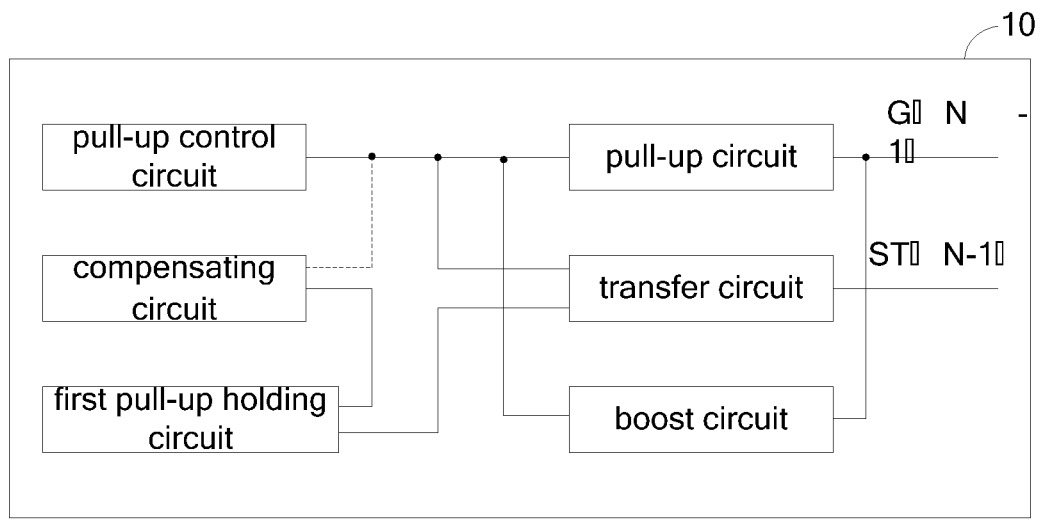
FIG. 1 is a structural diagram of a gate drive circuit according to the first embodiment of the present invention.
Figure 1:
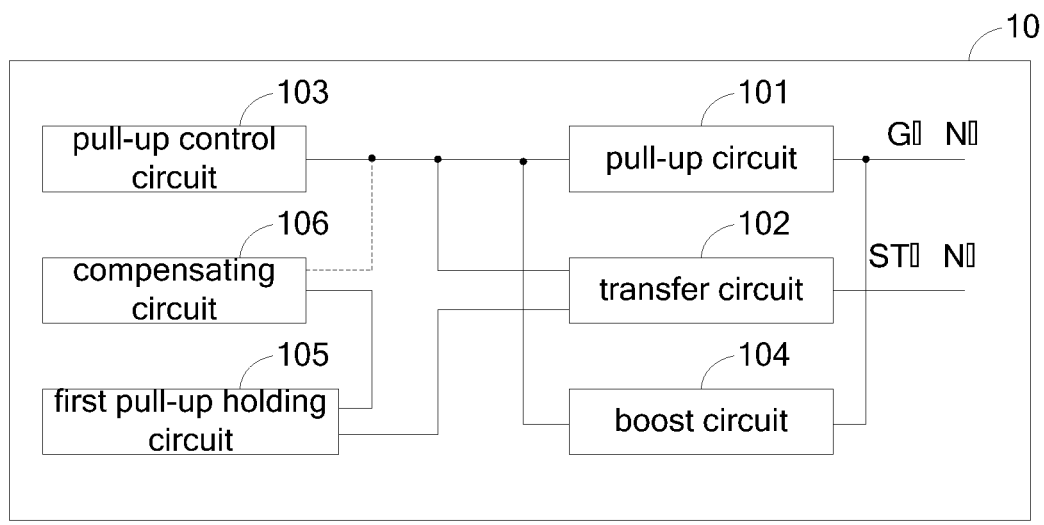

Please refer to FIG. 1. FIG. 1 is a structural diagram of a gate drive circuit according to the first embodiment of the present invention. As shown in FIG. 1, the gate drive circuit 1 disclosed in this embodiment comprises a plurality of shift register circuit 10, and the plurality of shift register circuit 10 are series cascade connected.

Figure 2:
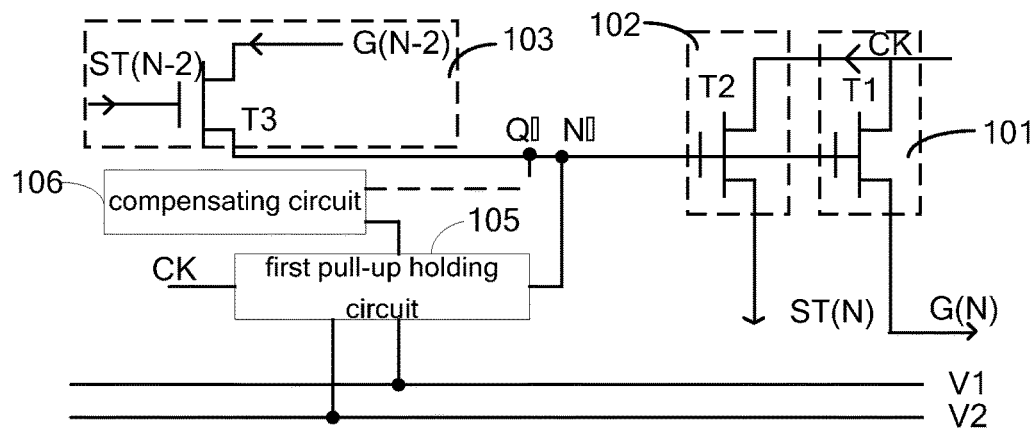
FIG. 2 is a circuit diagram of the gate drive circuit shown in FIG. 1.

Each shift register circuit 10 comprises a pull-up circuit 101, a transfer circuit 102, a pull-up control circuit 103, a boost circuit 104, a first pull-up holding circuit 105 and a compensating circuit 106. As shown in FIG. 2, the pull-up circuit 101 comprises a transistor T1, and a gate of the transistor T1 is coupled to a first node Q(N), i.e. the Q(N) point of the shift register circuit 10; a source of the transistor T1 is coupled to a first clock signal CK; a drain of the transistor T1 is coupled to a gate signal output end G(N) of the shift register circuit 10. The transfer circuit 102 comprises a transistor T2, and a gate of the transistor T2 is coupled to the first node Q(N), and a source of the transistor T2 is coupled to the first clock signal CK, and a drain of the transistor T2 is coupled to a drive signal output end ST(N) of the shift register circuit 10. The pull-up control circuit 103 comprises a transistor T3, and a gate of the transistor T3 is coupled to drive signal output end ST(N−2) of shift register circuit in the two former stage, and a source of the transistor T3 is coupled to gate signal output end G(N−2) of the shift register circuit in the two former stage, and a drain of the transistor T3 is coupled to the first node Q(N). The boost circuit 104 is coupled between the first node Q(N) and the gate signal output end G(N) of the shift register circuit 10 and employed to boost a voltage level of the first node Q(N). The first pull-up holding circuit 105 is coupled to the first node Q(N), the first clock signal CK, a first reference voltage V1 and a second reference voltage V2, and employed to keep a low voltage level of the first node Q(N). The compensating circuit 106 is coupled to the first node Q(N) or the first pull-up holding circuit 105, and employed to compensate the voltage level of the first node Q(N) or the first pull-up holding circuit 105.

Preferably, both the first reference voltage V1 and the second reference voltage V2 are negative voltage levels, and the second reference voltage V2 is smaller than the first reference voltage V1.

In this embodiment, the compensating circuit 106 is coupled to the first node Q(N) or the first pull-up holding circuit 105, and employed to compensate the voltage level of the first node Q(N) or the first pull-up holding circuit 105 which is capable of promoting the stability of long-term operation of the gate drive circuit 1 to raise the quality of the product.

Figure 3:
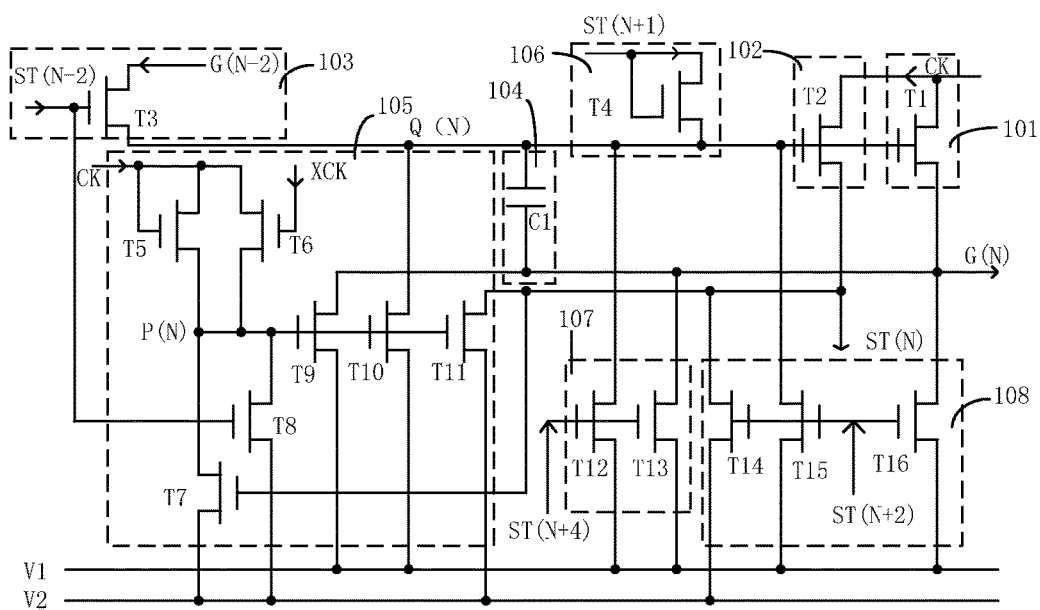
FIG. 3 is a circuit diagram of a gate drive circuit according to the second embodiment of the present invention.

The present invention further provides a second embodiment of the gate drive circuit. A detail description is conducted on the basis of the gate drive circuit 1 disclosed in the first embodiment. As shown in FIG. 3, the compensating circuit 106 further comprises a transistor T4, and a source and a drain of the transistor T4 are coupled to the drive signal output end ST(N+1) of the shift register circuit in the latter stage, and a drain of the transistor T4 is coupled to the first node Q(N). The compensating circuit 106 is employed to boost the voltage level of the first node Q(N) according to a drive signal outputted from a drive signal output end ST(N+1) of the shift register circuit in the latter stage.

The boost circuit 104 comprises a capacitor C1. One end of the capacitor C1 is coupled to the first node Q(N). The other end of the capacitor C1 is coupled to the gate signal output end G(N) of the shift register circuit 10. The first pull-up holding circuit 105 comprises a transistor T5, a transistor T6, a transistor T7, an transistor T8, a transistor T9, a transistor T10 and an transistor T11. Both the gate and the source of the transistor T5 are coupled to the first clock signal CK. The drain of the transistor T5 is coupled to a second node P(N) of the shift register circuit 10; the gate of the transistor T6 is coupled to a second clock signal XCK, and the source of the transistor T6 is coupled to the first clock signal CK, and the drain of the transistor T6 is coupled to the second node P(N); the gate of the transistor T7 is coupled to the drive signal output end ST(N) of the shift register circuit 10, and the source of the transistor T7 is coupled to the second node P(N), and the drain of the transistor T7 is coupled to the second reference voltage V2; the gate of the transistor T8 is coupled to the gate of the transistor T3, and the source of the transistor T8 is coupled to the second node P(N), and the drain of the transistor T8 is coupled to the second reference voltage V2; the gate of the transistor T9 is coupled to the second node P(N), and the source of the transistor T9 is coupled to the gate signal output end G(N) of the shift register circuit 10, and the drain of the transistor T9 is coupled to the first reference voltage V1; the gate of the transistor T10 is coupled to the second node P(N), and the source of the transistor T10 is coupled to the first node Q(N), and the drain of the transistor T10 is coupled to the first reference voltage V1; the gate of the transistor T11 is coupled to the second node P(N), and the source of the transistor T11 is coupled to the drive signal output end ST(N), and the drain of the transistor T11 is coupled to the second reference voltage V2.

The gate drive circuit further comprises a second pull-up holding circuit 107 and a pull-down circuit 108. The second pull-up holding circuit 107 comprises a transistor T12 and a transistor T13. Both the gate of the transistor T12 and the gate of the transistor T13 are coupled to a drive signal output end ST(N+4) of shift register circuit 10 in the four latter stage, and the source of the transistor T12 is coupled to the second node P(N), and the drain of the transistor T12 is coupled to the first reference voltage V1, and the source of the transistor T13 is coupled to the gate signal output end G(N), and the drain of the transistor T13 is coupled to the first reference voltage V1. The pull-down circuit 108 comprises a transistor T14, a transistor T15 and a transistor T16. All the gates of the transistor T14, the transistor T15 and the transistor T16 are coupled to a drive signal output end ST(N+2), and the source of the transistor T14 is coupled to the drive signal output end ST(N), and the drain of the transistor T14 is coupled to the second reference voltage V2, and the source of the transistor T15 is coupled to the first node Q(N), and the drain of the is coupled to the first reference voltage V1, and the source of the transistor T16 is coupled to the gate signal output end G(N), and the drain of the transistor T16 is coupled to the first reference voltage V1.

Figure 4:
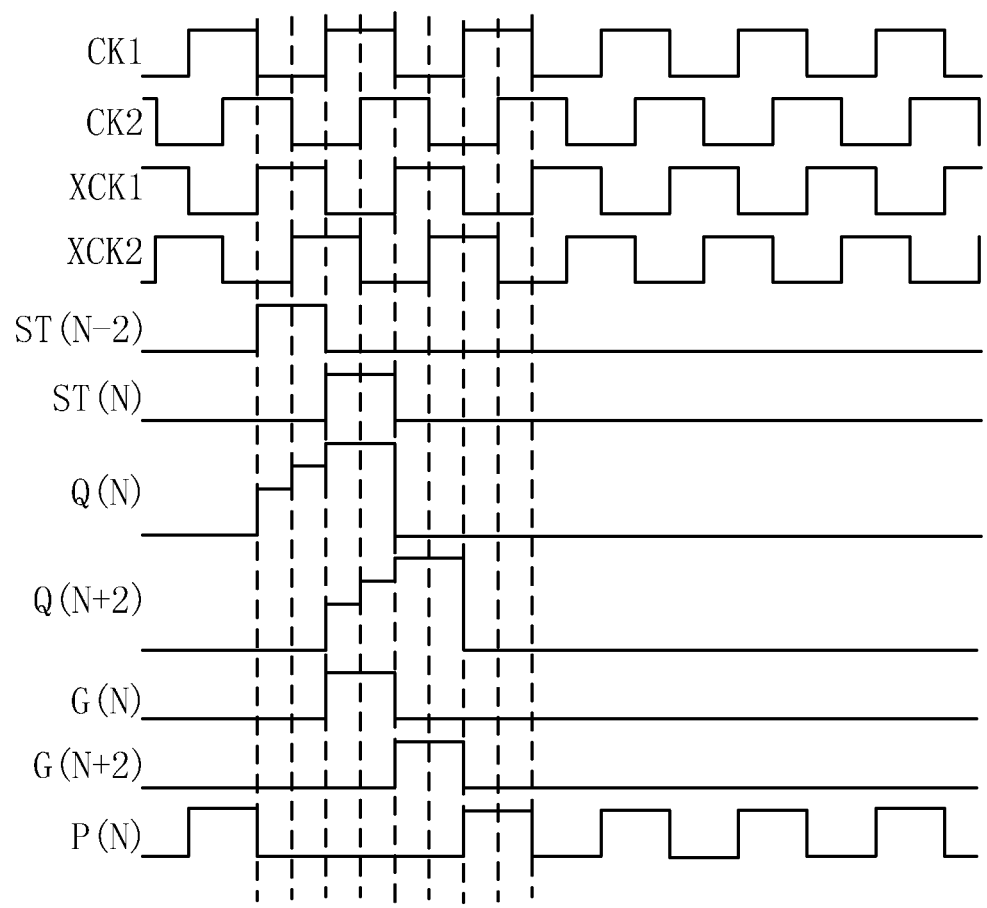
FIG. 4 is a sequence diagram of respective input signals, output signals and node voltages of the gate drive circuit shown in FIG. 3.

Please refer to FIG. 4. FIG. 4 is a sequence diagram of respective input signals, output signals and node voltages of the gate drive circuit shown in FIG. 3. As shown in FIG. 4, the first clock signals CK and the second clock signals XCK are two sets of signals which are phase complementary. The first clock signal CK1 and the second clock signal XCK1 are phase complementary. The first clock signal CK2 and the second clock signal XCK2 are phase complementary. The voltage level of the gate signal output end G(N) is pulled down to the low voltage level by the first reference voltage V1. When both the first node Q(N) and the gate signal output end G(N) are at high voltage level, the second node P(N) is pulled down to the low voltage level by the second reference voltage V2.

In the gate drive circuit disclosed by this embodiment, both the source and the drain of the transistor T4 are coupled to the drive signal output end ST(N+1) of the shift register circuit 10 in the latter stage, and the drain of the transistor T4 is coupled to the first node Q(N), and the compensating circuit 106 is employed to boost the voltage level of the first node Q(N) according to a drive signal outputted from a drive signal output end ST(N+1) of the shift register circuit in the latter stage. Accordingly, the stability of long-term operation of the gate drive circuit can be promoted.

Figure 5:
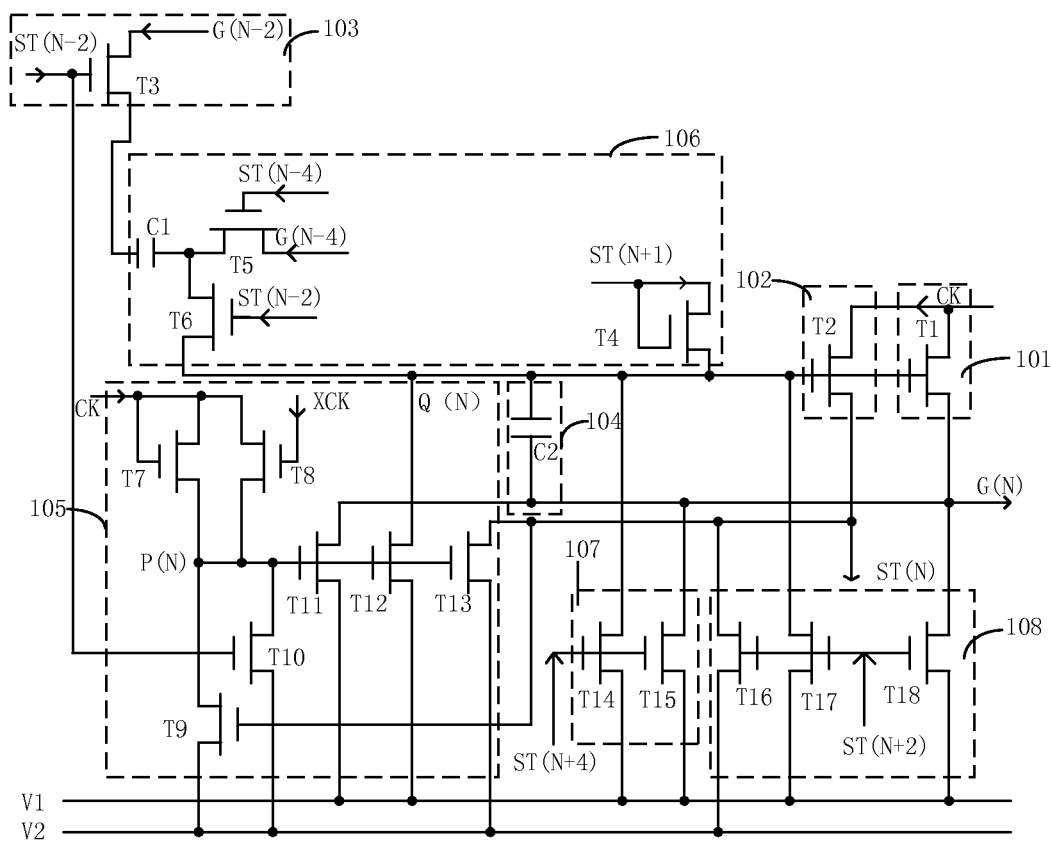
FIG. 5 is a circuit diagram of a gate drive circuit according to the third embodiment of the present invention.

The present invention further provides a third embodiment of the gate drive circuit. A detail description is conducted on the basis of the gate drive circuit 1 disclosed in the first embodiment. As shown in FIG. 5, the compensating circuit 106 comprises a transistor T4, a transistor T5, a transistor T6 and a capacitor C1. Both the source and the drain of the transistor T4 of the shift register circuit 10 are coupled to the drive signal output end ST(N+1) of the shift register circuit 10 in the latter stage. The drain of the transistor T4 is coupled to the first node Q(N). One end of the capacitor C1 is coupled to the drain of the transistor T3, and the other end of the capacitor C1 is coupled to the drain of the transistor T5 and the source of the transistor T6, and the gate of the transistor T5 is coupled to the drive signal output end ST(N−4) of shift register circuit 10 of four former stage, and a source of the transistor T5 is coupled to the gate signal output end ST(N−4) of the shift register circuit 10 of four former stage, and a gate of the transistor T6 is coupled to the drive signal output end ST(N−2) of the shift register circuit 10 in the two former stage, and a drain of the transistor T6 is coupled to the first node Q(N).

The boost circuit 104 comprises a capacitor C2. One end of the capacitor C2 is coupled to the first node Q(N), and the other end of the capacitor C2 is coupled to the gate signal output end G(N) of the shift register circuit 10. The first pull-up holding circuit 105 comprises a transistor T7, a transistor T8, a transistor T9, a transistor T10, a transistor T11, a transistor T12 and a transistor T13. Both the gate and the source of the transistor T7 are coupled to the first clock signal CK, and the drain of the transistor T7 is coupled to the second node P(N) of shift register circuit 10; the gate of the transistor T8 is coupled to the second clock signal XCK, and the source of the transistor T8 is coupled to the first clock signal CK, and the drain of the transistor T8 is coupled to the second node P(N); the gate of the transistor T9 is coupled to the drive signal output end ST(N) of shift register circuit 10, and the source of the transistor T9 is coupled to the second node P(N), and the drain of the transistor T9 is coupled to the second reference voltage V2; the gate of the transistor T10 is coupled to the gate of the transistor T3, and the source of the transistor T10 is coupled to the second node P(N), and the drain of the transistor T10 is coupled to the second reference voltage V2; the gate of the transistor T11 is coupled to the second node P(N), and the source of the transistor T11 is coupled to the gate signal output end G(N) of the shift register circuit 10, and the drain of the transistor T11 is coupled to the first reference voltage V1; the gate of the transistor T12 is coupled to the second node P(N), and the source of the transistor T12 is coupled to the first node Q(N), and the drain of the transistor T12 is coupled to the second node P(N); the gate of the transistor T13 is coupled to the second node P(N), and the source of the transistor T13 is coupled to the drive signal output end ST(N), and the drain of the transistor T13 is coupled to the second reference voltage V2.

The gate drive circuit further comprises a second pull-up holding circuit 107 and a pull-down circuit 108. The second pull-up holding circuit 107 comprises a transistor T14 and a transistor T15. Both the gate of the transistor T14 and the gate of the transistor T15 are coupled to a drive signal output end ST(N+4) of shift register circuit 10 in the four latter stage, and the source of the transistor T14 is coupled to the second node P(N), and the drain of the transistor T14 is coupled to the first reference voltage V1, and the source of the transistor T15 is coupled to the gate signal output end G(N), and the drain of the transistor T15 is coupled to the first reference voltage V1. The pull-down circuit 108 comprises a transistor T16, a transistor T17 and a transistor T18. All the gates of the transistor T16, the transistor T17 and the transistor T18 are coupled to a drive signal output end ST(N+2), and the source of the transistor T16 is coupled to the drive signal output end ST(N), and the drain of the transistor T16 is coupled to the second reference voltage V2, and the source of the transistor T17 is coupled to the first node Q(N), and the drain of the transistor T17 is coupled to the first reference voltage V1, and the source of the transistor T18 is coupled to the gate signal output end G(N), and the drain of the transistor T18 is coupled to the first reference voltage V1.

The drive signal output end ST(N−4) and the gate signal output end G(N−4) of shift register circuit of four former stage performs a phase-one charge to the capacitor C1. The drive signal output end ST(N−2) and the gate signal output end G(N−2) of shift register circuit of two former stage performs twice boosts to the capacitor C2. Before charging the first node Q(N), the first node Q(N) possesses a better voltage level in phase-one, about twice before process. The voltage level of the first node Q(N) in the function period is raised to be higher to promote the stability of long-term operation of the gate drive circuit.

Figure 6:
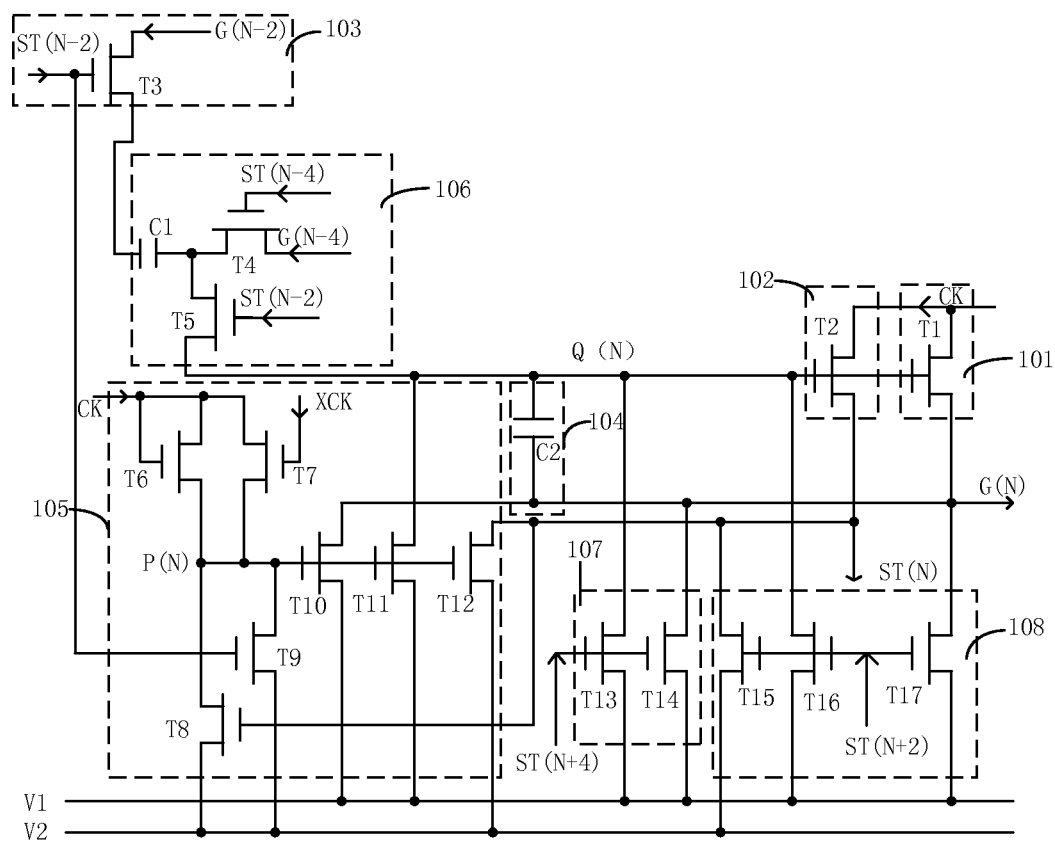
FIG. 6 is a circuit diagram of a gate drive circuit according to the fourth embodiment of the present invention.

The present invention further provides a fourth embodiment of the gate drive circuit. A detail description is conducted on the basis of the gate drive circuit 1 disclosed in the first embodiment. As shown in FIG. 6, the compensating circuit 106 comprises a transistor T4, a transistor T5 and a capacitor C1. One end of the capacitor C1 is coupled to the drain of the transistor T3, and the other end of the capacitor C1 is coupled to the drain of the transistor T4 and the source of the transistor T5, and the gate of the transistor T4 is coupled to the drive signal output end ST(N−4) of shift register circuit 10 of four former stage, and a source of the transistor T4 is coupled to the gate signal output end ST(N−4) of the shift register circuit 10 of four former stage, and a gate of the transistor T5 is coupled to the drive signal output end ST(N−2) of the shift register circuit 10 in the two former stage, and a drain of the transistor T5 is coupled to the first node Q(N).

The boost circuit 104 comprises a capacitor C2. One end of the capacitor C2 is coupled to the first node Q(N), and the other end of the capacitor C2 is coupled to the gate signal output end G(N) of the shift register circuit 10. The first pull-up holding circuit 105 comprises a transistor T6, a transistor T7, a transistor T8, a transistor T9, a transistor T10, a transistor T11 and a transistor T12. Both the gate and the source of the transistor T6 are coupled to the first clock signal CK, and the drain of the transistor T6 is coupled to the second node P(N) of shift register circuit 10; the gate of the transistor T7 is coupled to the second clock signal XCK, and the source of the transistor T7 is coupled to the first clock signal CK, and the drain of the transistor T7 is coupled to the second node P(N); the gate of the transistor T8 is coupled to the drive signal output end ST(N) of shift register circuit 10, and the source of the transistor T8 is coupled to the second node P(N), and the drain of the transistor T8 is coupled to the second reference voltage V2; the gate of the transistor T9 is coupled to the gate of the transistor T3, and the source of the transistor T9 is coupled to the second node P(N), and the drain of the transistor T9 is coupled to the second reference voltage V2; the gate of the transistor T10 is coupled to the second node P(N), and the source of the transistor T10 is coupled to the gate signal output end G(N) of the shift register circuit 10, and the drain of the transistor T10 is coupled to the first reference voltage V1; the gate of the transistor T11 is coupled to the second node P(N), and the source of the transistor T11 is coupled to the first node Q(N), and the drain of the transistor T11 is coupled to the second node P(N); the gate of the transistor T12 is coupled to the second node P(N), and the source of the transistor T12 is coupled to the drive signal output end ST(N), and the drain of the transistor T12 is coupled to the second reference voltage V2.

The gate drive circuit further comprises a second pull-up holding circuit 107 and a pull-down circuit 108. The second pull-up holding circuit 107 comprises a transistor T13 and a transistor T14. Both the gate of the transistor T13 and the gate of the transistor T14 are coupled to a drive signal output end ST(N+4) of shift register circuit 10 in the four latter stage, and the source of the transistor T13 is coupled to the second node P(N), and the drain of the transistor T13 is coupled to the first reference voltage V1, and the source of the transistor T14 is coupled to the gate signal output end G(N), and the drain of the transistor T14 is coupled to the first reference voltage V1. The pull-down circuit 108 comprises a transistor T15, a transistor T16 and a transistor T17. All the gates of the transistor T15, the transistor T16 and the transistor T17 are coupled to a drive signal output end ST(N+2), and the source of the transistor T15 is coupled to the drive signal output end ST(N), and the drain of the transistor T15 is coupled to the second reference voltage V2, and the source of the transistor T16 is coupled to the first node Q(N), and the drain of the transistor T16 is coupled to the first reference voltage V1, and the source of the transistor T17 is coupled to the gate signal output end G(N), and the drain of the transistor T17 is coupled to the first reference voltage V1.

Figure 7:
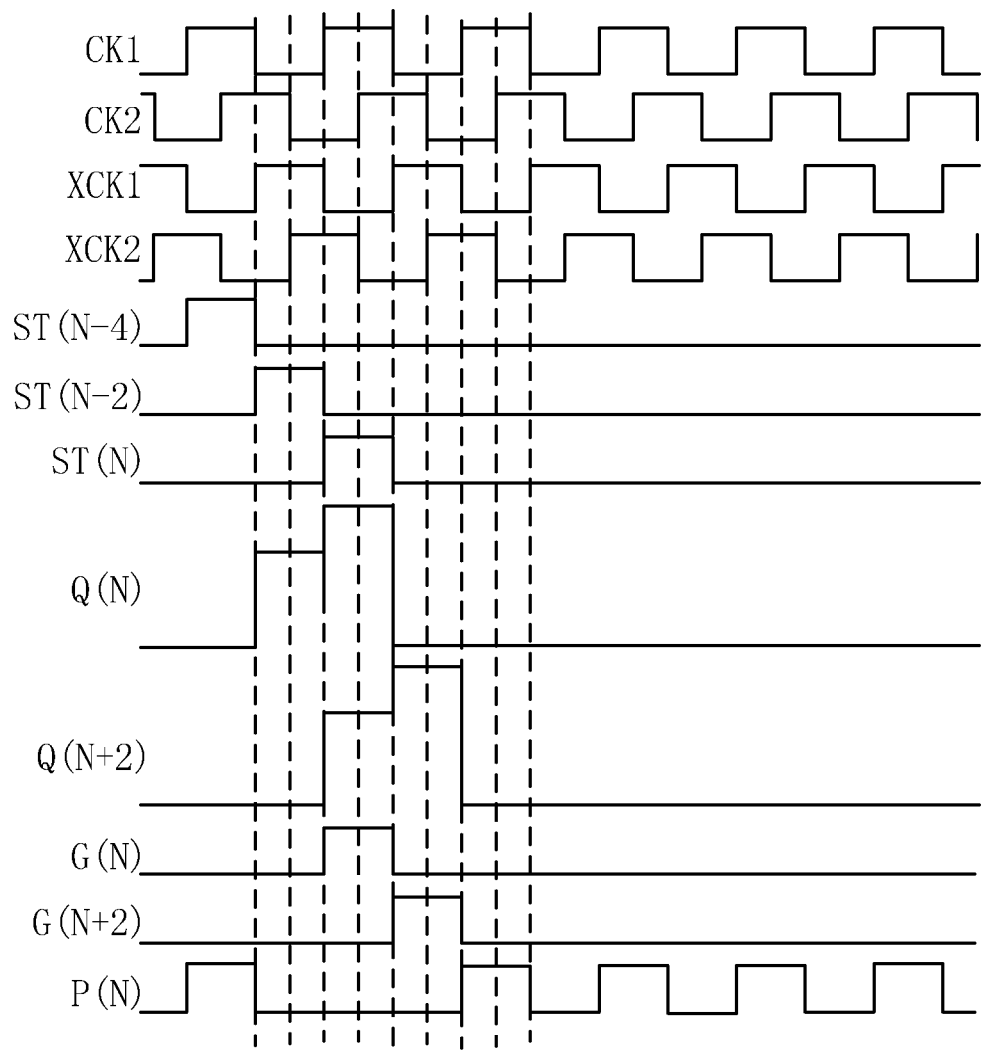
FIG. 7 is a sequence diagram of respective input signals, output signals and node voltages of the gate drive circuit shown in FIG. 6.

Please refer to FIG. 7. FIG. 7 is a sequence diagram of respective input signals, output signals and node voltages of the gate drive circuit shown in FIG. 6. As shown in FIG. 7, the first clock signals CK and the second clock signals XCK are two sets of signals which are phase complementary. The first clock signal CK1 and the second clock signal XCK1 are phase complementary. The first clock signal CK2 and the second clock signal XCK2 are phase complementary.

The drive signal output end ST(N−4) and the gate signal output end G(N−4) of shift register circuit of four former stage performs a phase-one charge to the capacitor C1. The drive signal output end ST(N−2) and the gate signal output end G(N−2) of shift register circuit of two former stage performs twice boosts to the capacitor C2. Before charging the first node Q(N), the first node Q(N) possesses a better voltage level in phase-one, about twice before process. The voltage level of the first node Q(N) in the function period is raised to be higher to promote the stability of long-term operation of the gate drive circuit.

Figure 8:
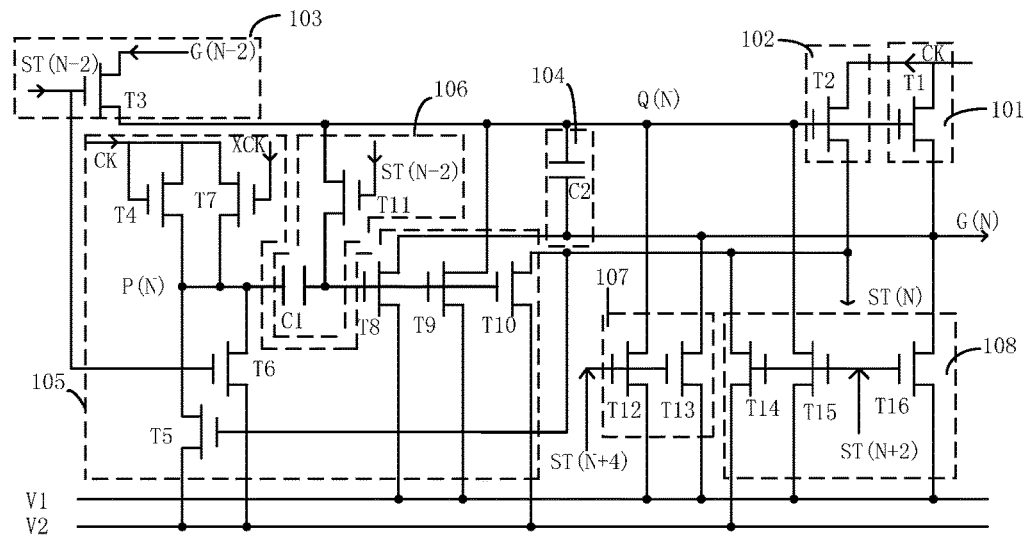
FIG. 8 is a circuit diagram of a gate drive circuit according to the fifth embodiment of the present invention.

The present invention further provides a fifth embodiment of the gate drive circuit. A detail description is conducted on the basis of the gate drive circuit 1 disclosed in the first embodiment. As shown in FIG. 8, the first pull-up holding circuit 105 comprises a transistor T4, a transistor T5, a transistor T6, a transistor T7, a transistor T8, a transistor T9 and a transistor T10. Both the gate and the source of the transistor T4 are coupled to the first clock signal CK, and the drain of the transistor T4 is coupled to the second node P(N) of shift register circuit 10; the gate of the transistor T5 is coupled to the ST(N), and the source of the transistor T5 is coupled to the second node P(N), and the drain of the transistor T5 is coupled to the second reference voltage V2; the gate of the transistor T6 is coupled to the drive signal output end ST(N−2) of shift register circuit 10 in the two former stage, and the source of the transistor T6 is coupled to the second node P(N), and the drain of the transistor T6 is coupled to the second reference voltage V2; the gate of the transistor T7 is coupled to the second clock signal XCK, and the source of the transistor T7 is coupled to the first clock signal CK, and the drain of the transistor T7 is coupled to the second node P(N); the gate of the transistor T8 is coupled to the compensating circuit 106, and the source of the transistor T8 is coupled to the gate signal output end G(N), and the drain of the transistor T8 is coupled to the first reference voltage V1; the gate of the transistor T9 is coupled to the compensating circuit 106, and the source of the transistor T9 is coupled to the first node Q(N), and the drain of the transistor T9 is coupled to the first reference voltage V1; the gate of the transistor T10 is coupled to the compensating circuit 106, and the source of the transistor T10 is coupled to the drive signal output end ST(N) of the shift register circuit, and the drain of the transistor T10 is coupled to the second reference voltage V2.

The compensating circuit 106 comprises a capacitor C1 and a transistor T11. One end of the capacitor C1 is coupled to the second node P(N), and the other end of the capacitor C1 is coupled to the gates of the transistor T8, the transistor T9 and the transistor T10; the gate of the transistor T11 is coupled to the drive signal output end ST(N−2) of shift register circuit 10 in the two former stage, and the source is coupled to the first node Q(N), and the drain of the transistor T11 is coupled to the other end of the capacitor C1.

The boost circuit 104 comprises a capacitor C2. One end of the capacitor C2 is coupled to the first node Q(N), and the other end of the capacitor C2 is coupled to the gate signal output end G(N) of the shift register circuit 10.

The gate drive circuit further comprises a second pull-up holding circuit 107 and a pull-down circuit 108. The second pull-up holding circuit 107 comprises a transistor T12 and a transistor T13. Both the gate of the transistor T12 and the gate of the transistor T13 are coupled to a drive signal output end ST(N+4) of shift register circuit 10 in the four latter stage, and the source of the transistor T12 is coupled to the second node P(N), and the drain of the transistor T12 is coupled to the first reference voltage V1, and the source of the transistor T13 is coupled to the gate signal output end G(N), and the drain of the transistor T13 is coupled to the first reference voltage V1. The pull-down circuit 108 comprises a transistor T14, a transistor T15 and a transistor T16. All the gates of the transistor T14, the transistor T15 and the transistor T16 are coupled to a drive signal output end ST(N+2), and the source of the transistor T14 is coupled to the drive signal output end ST(N), and the drain of the transistor T14 is coupled to the second reference voltage V2, and the source of the transistor T15 is coupled to the first node Q(N), and the drain of the transistor T175 is coupled to the first reference voltage V1, and the source of the transistor T16 is coupled to the gate signal output end G(N), and the drain of the transistor T16 is coupled to the first reference voltage V1.

The compensating circuit 106 boosts the voltage level of the second node P(N) with the capacitor C1 and the transistor 11 and still can be activated under circumstance that the stresses of the transistor T8, the transistor T9 and the transistor T10 are more serious.

Figure 9:
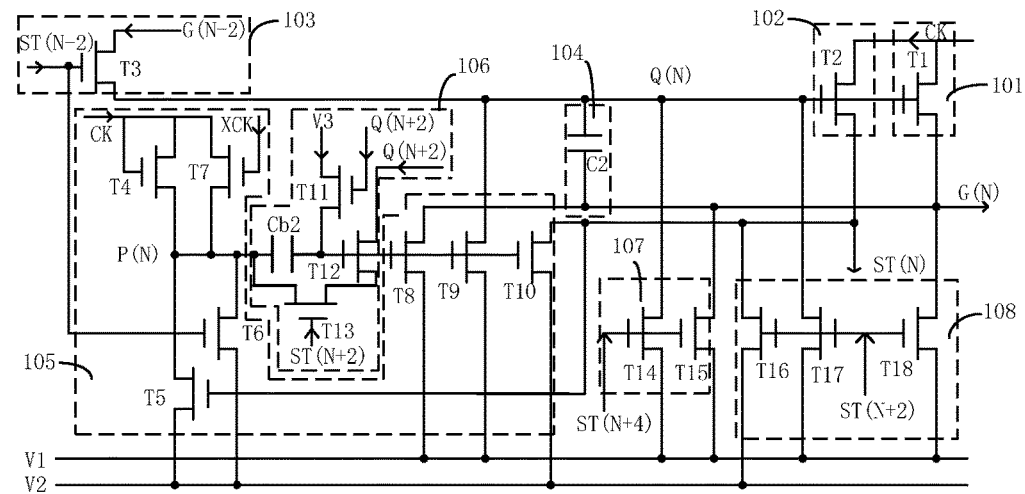
FIG. 9 is a circuit diagram of a gate drive circuit according to the sixth embodiment of the present invention.

The present invention further provides a sixth embodiment of the gate drive circuit. A detail description is conducted on the basis of the gate drive circuit 1 disclosed in the first embodiment. As shown in FIG. 9, the first pull-up holding circuit 105 comprises a transistor T4, a transistor T5, a transistor T6, a transistor T7, a transistor T8, a transistor T9 and a transistor T10.

the first pull-up holding circuit 105 comprises a transistor T4, a transistor T5, a transistor T6, a transistor T7, a transistor T8, a transistor T9 and a transistor T10. Both the gate and the source of the transistor T4 are coupled to the first clock signal CK, and the drain of the transistor T4 is coupled to the second node P(N) of shift register circuit 10; the gate of the transistor T5 is coupled to the ST(N), and the source of the transistor T5 is coupled to the second node P(N), and the drain of the transistor T5 is coupled to the second reference voltage V2; the gate of the transistor T6 is coupled to the drive signal output end ST(N−2) of shift register circuit 10 in the two former stage, and the source of the transistor T6 is coupled to the second node P(N), and the drain of the transistor T6 is coupled to the second reference voltage V2; the gate of the transistor T7 is coupled to the second clock signal XCK, and the source of the transistor T7 is coupled to the first clock signal CK, and the drain of the transistor T7 is coupled to the second node P(N); the gate of the transistor T8 is coupled to the compensating circuit 106, and the source of the transistor T8 is coupled to the gate signal output end G(N), and the drain of the transistor T8 is coupled to the first reference voltage V1; the gate of the transistor T9 is coupled to the compensating circuit 106, and the source of the transistor T9 is coupled to the first node Q(N), and the drain of the transistor T9 is coupled to the first reference voltage V1; the gate of the transistor T10 is coupled to the compensating circuit 106, and the source of the transistor T10 is coupled to the drive signal output end ST(N) of the shift register circuit, and the drain of the transistor T10 is coupled to the second reference voltage V2.

The compensating circuit 106 comprises a capacitor C1, a transistor T11, a transistor T12 and a transistor T13. One end of the capacitor C1 is coupled to the second node P(N), and the other end of the capacitor C1 is coupled to the gates of the transistor T8, the transistor T9 and the transistor T10. The gate of the transistor T11 is coupled to the first node Q(N+2) of the shift register circuit 10 in the two latter stage, and the source of the transistor T11 is coupled to the third reference voltage V3, and the drain of the transistor T11 is coupled to the other end of the capacitor C1. The gate of the transistor T12 is coupled to the other end of the capacitor C1, and the source of the transistor T12 is coupled to the first node Q(N+2) of the shift register circuit in the two latter stage. The gate of the transistor T13 is coupled to the drive signal output end ST(N+2) of the shift register circuit 10 in the two latter stage, and the source of the transistor T13 is coupled to the one end of the capacitor C1, and the drain of the transistor T13 is coupled to the drain of the transistor T12.

The boost circuit 104 comprises a capacitor C2. One end of the capacitor C2 is coupled to the first node Q(N), and the other end of the capacitor C2 is coupled to the gate signal output end G(N) of the shift register circuit 10.

The gate drive circuit further comprises a second pull-up holding circuit 107 and a pull-down circuit 108. The second pull-up holding circuit 107 comprises a transistor T14 and a transistor T15. Both the gate of the transistor T14 and the gate of the transistor T15 are coupled to a drive signal output end ST(N+4) of shift register circuit 10 in the four latter stage, and the source of the transistor T14 is coupled to the second node P(N), and the drain of the transistor T14 is coupled to the first reference voltage V1, and the source of the transistor T15 is coupled to the gate signal output end G(N), and the drain of the transistor T15 is coupled to the first reference voltage V1. The pull-down circuit 108 comprises a transistor T16, a transistor T17 and a transistor T18. All the gates of the transistor T16, the transistor T17 and the transistor T18 are coupled to a drive signal output end ST(N+2), and the source of the transistor T16 is coupled to the drive signal output end ST(N), and the drain of the transistor T16 is coupled to the second reference voltage V2, and the source of the transistor T17 is coupled to the first node Q(N), and the drain of the transistor T17 is coupled to the first reference voltage V1, and the source of the transistor T18 is coupled to the gate signal output end G(N), and the drain of the transistor T18 is coupled to the first reference voltage V1.

The compensating circuit 106 boosts the voltage level of the second node P(N) with the capacitor C1 and the transistor 11, the transistor 12 and the transistor 13 to compensate the voltage drifts of the transistor 8, the transistor 9 and the transistor 10 and still can be activated under circumstance that the stresses of the transistor T8, the transistor T9 and the transistor T10 are more serious.

According to the aforesaid embodiments, the present invention boosts the first node Q(N) to perform three phases charge to the first node Q(N) for guaranteeing the normal output of the gate drive circuit 1; moreover, the present invention provides the compensating circuit 106 for the second node P(N) to prevent that the abnormal voltage level of the second node P(N) results in the insufficient pulling down abilities of the first node Q(N) and the second node P(N) which directly leads to the circuit failure. With the compensating circuit 106, the issue that the threshold voltage of the transistor drifts to lead to the bad activation of the pulling down part of the circuit can be prevented.

Figure 10:
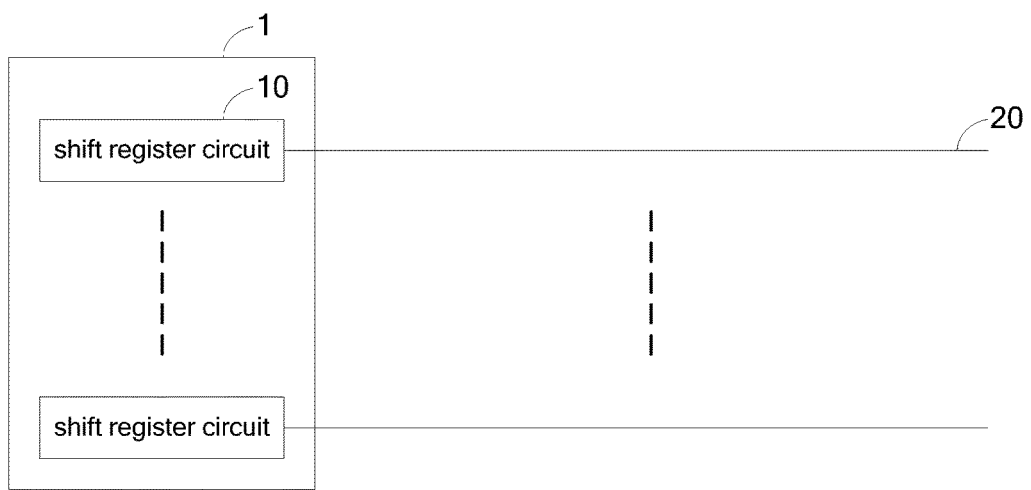
FIG. 10 is a structural diagram of a liquid crystal display panel according to the first embodiment of the present invention.

The present invention further provides a liquid crystal display panel. As shown in FIG. 10, the liquid crystal display panel 2 comprises the foregoing gate drive circuit 1 and a plurality of gate lines 20. The gate lines 20 are respectively coupled to gate signal output end G(N) of corresponding shift register circuit 10 in the gate drive circuit 1.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A gate drive circuit, wherein the gate drive circuit comprises a plurality of shift register circuits, and the plurality of shift register circuits are series cascade connected, and each shift register circuit comprises:
    a pull-up circuit, comprising a first transistor, and a gate of the first transistor is coupled to a first node, and a source is coupled to a first clock signal, and a drain is coupled to a gate signal output end of the shift register circuit;
    a transfer circuit, comprising a second transistor, and a gate of the second transistor is coupled to the first node, and a source is coupled to the first clock signal, and a drain is coupled to a drive signal output end of the shift register circuit;
    a pull-up control circuit, comprising a third transistor, and a gate of the third transistor is coupled to drive signal output end of shift register circuit in the two former stage, and a source is coupled to gate signal output end of the shift register circuit in the second preceding stage, and a drain is coupled to the first node;
    a boost circuit, coupled between the first node and the gate signal output end of the shift register circuit and employed to boost a voltage level of the first node;
    a first pull-up holding circuit, coupled to the first node, the first clock signal, a first reference voltage and a second reference voltage, and employed to keep a low voltage level of the first node;
    a compensating circuit, coupled to the first node or the first pull-up holding circuit, and employed to compensate the voltage level of the first node or the first pull-up holding circuit.

2. The gate drive circuit according to claim 1, wherein the compensating circuit further comprises a fourth transistor, and a source and a gate of the fourth transistor are coupled to the drive signal output end of the shift register circuit in the latter stage, and a drain of the fourth transistor is coupled to the first node, and employed to boost the voltage level of the first node according to a drive signal outputted from a drive signal output end of the shift register circuit in the latter stage.

3. The gate drive circuit according to claim 2, wherein the compensating circuit further comprises a fifth transistor, a sixth transistor and a first capacitor, and one end of the first capacitor is coupled to the drain of the third transistor, and the other end of the first capacitor is coupled to a drain of the fifth transistor and a source of the sixth transistor, and a gate of the fifth transistor is coupled to drive signal output end of shift register circuit of four former stage, and a source of the fifth transistor is coupled to the gate signal output end of the shift register circuit of four former stage, and a gate of the sixth transistor is coupled to the drive signal output end of the shift register circuit in the two former stage, and a drain of the sixth transistor is coupled to the first node.

4. The gate drive circuit according to claim 1, wherein the compensating circuit comprises a fourth transistor, a fifth transistor and a first capacitor, and one end of the first capacitor is coupled to the drain of the third transistor, and the other end of the first capacitor is coupled to a drain of the fourth transistor and a source of the fifth transistor, and a gate of the fourth transistor is coupled to drive signal output end of shift register circuit of four former stage, and a source of the fourth transistor is coupled to the gate signal output end of the shift register circuit of four former stage, and a gate of the fifth transistor is coupled to the drive signal output end of the shift register circuit in the two former stage, and a drain of the fifth transistor is coupled to the first node.

5. The gate drive circuit according to claim 1, wherein the first pull-up holding circuit further comprises:
a fourth transistor, and a gate and a source of the fourth transistor is coupled to the first clock signal, and a drain is coupled to a second node;
a fifth transistor, and a gate of the fifth transistor is coupled to the drive signal output end, and a source is coupled to the second node, and a drain is coupled to the second reference voltage;
a sixth transistor, and a gate of the sixth transistor is coupled to the drive signal output end of the shift register circuit in the two former stage, and a source is coupled to the second node, and a drain is coupled to the second reference voltage;
a seventh transistor, a gate of the seventh transistor is coupled to a second clock signal, and a source is coupled to the first clock signal, and a drain is coupled to the second node;
an eighth transistor, and a gate of the eighth transistor is coupled to the compensating circuit, and a source is coupled to the gate signal output end of the shift register circuit, and a drain is coupled to the first reference voltage;
a ninth transistor, and a gate of the ninth transistor is coupled to the compensating circuit, and a source is coupled to the first node, and a drain is coupled to the first reference voltage;
a tenth transistor, and a gate of the tenth transistor is coupled to the compensating circuit, and a source is coupled to the drive signal output end, and a drain is coupled to the second reference voltage.

6. The gate drive circuit according to claim 5, wherein the compensating circuit further comprises:
a first capacitor, and one end of the first capacitor is coupled to the second node, and the other end is coupled to the gate of the eighth transistor, the gate of the ninth transistor and the gate of the tenth transistor;
an eleventh transistor, and a gate of the eleventh transistor is coupled to the drive signal output end of the shift register circuit in the two former stage, and a source is coupled to the first node, and a drain is coupled to the other end of the first capacitor.

7. The gate drive circuit according to claim 5, wherein the compensating circuit further comprises:
a first capacitor, and one end of the first capacitor is coupled to the second node, and the other end is coupled to the gate of the eighth transistor, the gate of the ninth transistor and the gate of the tenth transistor;
an eleventh transistor, and a gate of the eleventh transistor is coupled to drive signal output end of shift register circuit in the two latter stage, and a source is coupled to a third reference voltage, and a drain is coupled to the other end of the first capacitor;
a twelfth transistor, and a gate of the twelfth transistor is coupled to the other end of the first capacitor, and a source is coupled to the first nodes of the shift register circuits in the two latter stage;
a thirteenth transistor, and a gate of the thirteenth transistor is coupled to the drive signal output end of the shift register circuit in the two latter stage, and a source is coupled to the one end of the first capacitor, and a drain is coupled to a drain of the twelfth transistor.

8. The gate drive circuit according to claim 1, wherein the each shift register circuit further comprises a second pull-up holding circuit, and the second pull-up holding circuit comprises:
a fourth transistor, and a gate of the fourth transistor is coupled to drive signal output end of shift register circuit in the four latter stage, and a source is coupled to the first node, and a drain is coupled to the first reference voltage;
a fifth transistor, and a gate of the fifth transistor is coupled to the drive signal output end of the shift register circuit in the four latter stage, and a source is coupled to a signal output end of the shift register circuit, and a drain is coupled to the first reference voltage.

9. The gate drive circuit according to claim 8, wherein the each shift register circuit further comprises a pull-down circuit, and the pull-down circuit comprises:
a sixth transistor, and a gate of the sixth transistor is coupled to the drive signal output end of the shift register circuit in the two latter stage, and a source is coupled to the drive signal output end of the shift register circuit, and a drain is coupled to the second reference voltage;
a seventh transistor, a gate of the seventh transistor is coupled to the drive signal output end of the shift register circuit in the two latter stage, and a source is coupled to the first node, and a drain is coupled to the first reference voltage;
an eighth transistor, and a gate of the eighth transistor is coupled to the drive signal output end of the shift register circuit in the two latter stage, and a source is coupled to the signal output end of the shift register circuit, and a drain is coupled to the first reference voltage.

10. A liquid crystal display panel, wherein the liquid crystal display panel comprises a gate drive circuit and a plurality of gate lines, wherein the gate lines are respectively coupled to gate signal output end of a shift register circuit in the gate drive circuit; the gate drive circuit comprises a plurality of shift register circuits, and the plurality of shift register circuits are series cascade connected, and each shift register circuit comprises:
a pull-up circuit, comprising a first transistor, and a gate of the first transistor is coupled to a first node, and a source is coupled to a first clock signal, and a drain is coupled to a gate signal output end of the shift register circuit;

a transfer circuit, comprising a second transistor, and a gate of the second transistor is coupled to the first node, and a source is coupled to the first clock signal, and a drain is coupled to a drive signal output end of the shift register circuit;

a pull-up control circuit, comprising a third transistor, and a gate of the third transistor is coupled to drive signal output end of shift register circuit in the second preceding stage, and a source is coupled to gate signal output end of the shift register circuit in the two former stage, and a drain is coupled to the first node;

a boost circuit, coupled between the first node and the gate signal output end of the shift register circuit and employed to boost a voltage level of the first node;

a first pull-up holding circuit, coupled to the first node, the first clock signal, a first reference voltage and a second reference voltage, and employed to keep a low voltage level of the first node;

a compensating circuit, coupled to the first node or the first pull-up holding circuit, and employed to compensate the voltage level of the first node or the first pull-up holding circuit.

11. The liquid crystal display panel according to claim 10, wherein the compensating circuit further comprises a fourth transistor, and a source and a gate of the fourth transistor are coupled to the drive signal output end of the shift register circuit in the latter stage, and a drain of the fourth transistor is coupled to the first node, and employed to boost the voltage level of the first node according to a drive signal outputted from a drive signal output end of the shift register circuit in the latter stage.

12. The liquid crystal display panel according to claim 11, wherein the compensating circuit further comprises a fifth transistor, a sixth transistor and a first capacitor, and one end of the first capacitor is coupled to the drain of the third transistor, and the other end of the first capacitor is coupled to a drain of the fifth transistor and a source of the sixth transistor, and a gate of the fifth transistor is coupled to drive signal output end of shift register circuit of four former stage, and a source of the fifth transistor is coupled to the gate signal output end of the shift register circuit of four former stage, and a gate of the sixth transistor is coupled to the drive signal output end of the shift register circuit in the two former stage, and a drain of the sixth transistor is coupled to the first node.

13. The liquid crystal display panel according to claim 10, wherein the compensating circuit comprises a fourth transistor, a fifth transistor and a first capacitor, and one end of the first capacitor is coupled to the drain of the third transistor, and the other end of the first capacitor is coupled to a drain of the fourth transistor and a source of the fifth transistor, and a gate of the fourth transistor is coupled to drive signal output end of shift register circuit of four former stage, and a source of the fourth transistor is coupled to the gate signal output end of the shift register circuit of four former stage, and a gate of the fifth transistor is coupled to the drive signal output end of the shift register circuit in the two former stage, and a drain of the fifth transistor is coupled to the first node.

14. The liquid crystal display panel according to claim 10, wherein the first pull-up holding circuit further comprises:

a fourth transistor, and a gate and a source of the fourth transistor is coupled to the first clock signal, and a drain is coupled to a second node;

a fifth transistor, and a gate of the fifth transistor is coupled to the drive signal output end, and a source is coupled to the second node, and a drain is coupled to the second reference voltage;

a sixth transistor, and a gate of the sixth transistor is coupled to the drive signal output end of the shift register circuit in the two former stage, and a source is coupled to the second node, and a drain is coupled to the second reference voltage;

a seventh transistor, a gate of the seventh transistor is coupled to a second clock signal, and a source is coupled to the first clock signal, and a drain is coupled to the second node;

an eighth transistor, and a gate of the eighth transistor is coupled to the compensating circuit, and a source is coupled to the gate signal output end of the shift register circuit, and a drain is coupled to the first reference voltage;

a ninth transistor, and a gate of the ninth transistor is coupled to the compensating circuit, and a source is coupled to the first node, and a drain is coupled to the first reference voltage;

a tenth transistor, and a gate of the tenth transistor is coupled to the compensating circuit, and a source is coupled to the drive signal output end, and a drain is coupled to the second reference voltage.

15. The liquid crystal display panel according to claim 14, wherein the compensating circuit further comprises:

a first capacitor, and one end of the first capacitor is coupled to the second node, and the other end is coupled to the gate of the eighth transistor, the gate of the ninth transistor and the gate of the tenth transistor;

an eleventh transistor, and a gate of the eleventh transistor is coupled to the drive signal output end of the shift register circuit in the two former stage, and a source is coupled to the first node, and a drain is coupled to the other end of the first capacitor.

16. The liquid crystal display panel according to claim 14, wherein the compensating circuit further comprises:

a first capacitor, and one end of the first capacitor is coupled to the second node, and the other end is coupled to the gate of the eighth transistor, the gate of the ninth transistor and the gate of the tenth transistor;

an eleventh transistor, and a gate of the eleventh transistor is coupled to drive signal output end of shift register circuit in the two latter stage, and a source is coupled to a third reference voltage, and a drain is coupled to the other end of the first capacitor;

a twelfth transistor, and a gate of the twelfth transistor is coupled to the other end of the first capacitor, and a source is coupled to the first nodes of the shift register circuits in the two latter stage;

a thirteenth transistor, and a gate of the thirteenth transistor is coupled to the drive signal output end of the shift register circuit in the two latter stage, and a source is coupled to the one end of the first capacitor, and a drain is coupled to a drain of the twelfth transistor.

17. The liquid crystal display panel according to claim 10, wherein the each shift register circuit further comprises a second pull-up holding circuit, and the second pull-up holding circuit comprises:

a fourth transistor, and a gate of the fourth transistor is coupled to drive signal output end of shift register circuit in the four latter stage, and a source is coupled to the first node, and a drain is coupled to the first reference voltage;

a fifth transistor, and a gate of the fifth transistor is coupled to the drive signal output end of the shift register circuit in the four latter stage, and a source is coupled to a signal output end of the shift register circuit, and a drain is coupled to the first reference voltage.

18. The liquid crystal display panel according to claim 17, wherein the each shift register circuit further comprises a pull-down circuit, and the pull-down circuit comprises:
- a sixth transistor, and a gate of the sixth transistor is coupled to the drive signal output end of the shift register circuit in the two latter stage, and a source is coupled to the drive signal output end of the shift register circuit, and a drain is coupled to the second reference voltage;
- a seventh transistor, a gate of the seventh transistor is coupled to the drive signal output end of the shift register circuit in the two latter stage, and a source is coupled to the first node, and a drain is coupled to the first reference voltage;
- an eighth transistor, and a gate of the eighth transistor is coupled to the drive signal output end of the shift register circuit in the two latter stage, and a source is coupled to the signal output end of the shift register circuit, and a drain is coupled to the first reference voltage.

* * * * *